United States Patent
Chen et al.

(10) Patent No.: US 12,159,949 B2
(45) Date of Patent: Dec. 3, 2024

(54) METHOD FOR FORMING HOLE TRANSPORT LAYER ON SURFACE OF SUBSTRATE, HOLE TRANSPORT LAYER, SOLAR CELL AND PREPARATION METHOD THEREFOR, AND PHOTOVOLTAIC MODULE

(71) Applicant: CONTEMPORARY AMPEREX TECHNOLOGY (HONG KONG) LIMITED, Hong Kong (CN)

(72) Inventors: Guodong Chen, Ningde (CN); Yongsheng Guo, Ningde (CN); Weile Lin, Ningde (CN); Yandong Wang, Ningde (CN); Zhaohui Liu, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

(21) Appl. No.: 18/322,586

(22) Filed: May 23, 2023

(65) Prior Publication Data

US 2023/0299218 A1    Sep. 21, 2023

Related U.S. Application Data

(63) Continuation of application No. PCT/CN2021/132108, filed on Nov. 21, 2021.

(51) Int. Cl.
*H01L 31/0296*    (2006.01)
*C23C 14/35*    (2006.01)
*H01L 31/18*    (2006.01)

(52) U.S. Cl.
CPC ........ *H01L 31/02963* (2013.01); *C23C 14/35* (2013.01); *H01L 31/1828* (2013.01)

(58) Field of Classification Search
CPC . H01L 31/02963; H01L 31/032; H10K 30/40; H10K 30/86
See application file for complete search history.

(56) References Cited

U.S. PATENT DOCUMENTS

| | | | | |
|---|---|---|---|---|
| 2006/0162765 A1* | 7/2006 | Minoura | ................... | C25D 9/08 |
| | | | | 438/57 |
| 2015/0034162 A1* | 2/2015 | Hirose | ................ | C09B 23/0058 |
| | | | | 438/82 |
| 2020/0006689 A1* | 1/2020 | Heggemann | ......... | H10K 85/622 |

FOREIGN PATENT DOCUMENTS

| | | |
|---|---|---|
| AU | 2020100802 A4 | 6/2020 |
| CN | 106024927 A | 10/2016 |
| | (Continued) | |

OTHER PUBLICATIONS

CN 113410321 A machine translation as provided by FIT database, translated on Aug. 10, 2024.*

(Continued)

*Primary Examiner* — Golam Mowla
(74) *Attorney, Agent, or Firm* — ANOVA LAW GROUP, PLLC

(57) ABSTRACT

A method for forming a hole transport layer on a surface of a substrate includes providing M target materials comprising inorganic hole transport materials and forming the hole transport layer on the surface of the substrate using magnetron sputtering. The hold transport layer at least comprises N consecutive sub-layers. M and N are integers and $2 \leq N \leq M$. One of the M target materials is a doped target material further comprising a doping material.

20 Claims, 1 Drawing Sheet

(56) References Cited

FOREIGN PATENT DOCUMENTS

| CN | 108063186 A | 5/2018 |
| CN | 109065659 A | 12/2018 |
| CN | 109912458 A | 6/2019 |
| CN | 110444611 A | 11/2019 |
| CN | 113241410 A | 8/2021 |
| CN | 113410321 A | 9/2021 |

OTHER PUBLICATIONS

The European Patent Office (EPO) The Extended European Search Report for Application No. 21962759.3 Dec. 4, 2023 7 Pages.
Wang Kuo Chin et al. "Low-Temperature Sputtered Nickel Oxide Compact Thin Film as Effective Electron Blocking Layer for Mesoscopic NiO/CH3NHPBI3 Perovskite Heterojunction Solar Cells", Applied Materials and Interfaces, vol. 6, No. 15, Jul. 23, 2014, pp. 11851-11858.
The World Intellectual Property Organization (WIPO) International Search Report for PCT/CN2021/132108 Aug. 16, 2022 6 pages (including English translation).

* cited by examiner

METHOD FOR FORMING HOLE TRANSPORT LAYER ON SURFACE OF SUBSTRATE, HOLE TRANSPORT LAYER, SOLAR CELL AND PREPARATION METHOD THEREFOR, AND PHOTOVOLTAIC MODULE

CROSS-REFERENCE TO RELATED APPLICATION

This application is a continuation of International Application No. PCT/CN2021/132108, filed on Nov. 22, 2021, the entire content of which is incorporated herein by reference.

TECHNICAL FIELD

The present application belongs to the technical field of solar cells, and in particular relates to a method for forming a hole transport layer on the surface of a substrate, a hole transport layer, a solar cell and a preparation method therefor, and a photovoltaic module.

BACKGROUND ART

With the development of modern industry, the problems of global energy shortage and environmental pollution has become increasingly prominent. As an ideal renewable energy, a solar cell has been paid more and more attention. A solar cell, also called a photovoltaic cell, is a device that directly converts light energy into electric energy by means of photoelectric effect or photochemical effect. Perovskite solar cell is a solar cell using a perovskite material as a light absorbing layer, which has rapidly achieved high energy conversion efficiency within a few years after its birth, and has attracted wide attention in recent years. Although the energy conversion efficiency of the perovskite solar cell has exceeded 21% at present, its stability is still an obstacle to its commercialization. Therefore, how to improve the stability of solar cells is still an urgent problem to be solved.

SUMMARY

An objective of the present application is to provide a method for forming a hole transport layer on the surface of a substrate, a hole transport layer, a solar cell and a preparation method therefor, and a photovoltaic module, aiming to make the stability and consistency of the solar cell better, and the energy level structure of the hole transport layer in the solar cell can be conveniently adjusted, which is beneficial to the energy level matching and optimization between a light absorbing layer/a hole transport layer.

A first aspect of the present application provides a method for forming a hole transport layer on the surface of a substrate, comprising the steps of: providing M target materials comprising inorganic hole transport materials and forming a hole transport layer at least comprising N consecutive sub-layers on the surface of the substrate by using a magnetron sputtering principle, wherein $2 \leq N \leq M$, and at least one of the M target materials is a doped target material further comprising a doping material.

The inventor of the present application combines inorganic hole transport materials and doping materials to form doped target materials for the first time, each target material is plasmatized by using the magnetron sputtering principle and then sprayed onto a substrate to form a hole transport layer. The method of the present application can also conveniently adjust the specific composition of the target materials or replace the target materials to form the required hole transport layer. Compared with the preparation method of film forming by coating, the method for forming a hole transport layer of the present application is simple, and the obtained hole transport layer has higher stability and consistency. The method of the present application can conveniently and accurately adjust the composition of each target material according to actual requirements (for example, adjusting types and/or content of inorganic hole transport materials, types and/or content of doping materials, and the like), so as to obtain a hole transport layer with the required energy level.

In any embodiment of the present application, the type of the inorganic hole transport material of each target material is the same as each other.

In any embodiment of the present application, the inorganic hole transport materials are P-type semiconductors.

In any embodiment of the present application, inorganic hole transport materials are selected from one of $NiO_x$, CuO, $Cu_2O$, $Cu_2S$, CuI, CuSCN, $CuGaO_2$, CoO, $Cr_2O_3$, SnO, SnS, $Hg_2O$, PbO, $Ag_2O$, MnO, $MnO_2$, or $Pr_2O_3$. Optionally, the inorganic hole transport materials are selected from $NiO_x$.

In any embodiment of the present application, the type of the doping material of each doped target material is the same as or different from each other.

In any embodiment of the present application, the doping material of the each doped target material is independently selected from one or more of $NiO_x$, CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$.

In any embodiment of the present application, the 1st target material or the M-th target material is a doped target material, and the doping material at least comprises KI.

In any embodiment of the present application, based on the mass of each doped target material, the total mass percentage content of the doping material of each doped target material is $\leq 25\%$. Optionally, the total mass percentage content of the doping material of each doped target material is 0.1%-25%.

In any embodiment of the present application, when the doped target materials comprise one or more of $NiO_x$, CuO, $Cu_2O$, $Cu_2S$, CuI, CuSCN, $CuGaO_2$, Ag, and $Ag_2O$, the mass percentage content of the doping material in the doped target material is independently $\leq 15\%$.

In any embodiment of the present application, when the doped target materials comprise one or two of MgO and KI, the mass percentage content of the doping material in the doped target material is independently $\leq 20\%$.

In any embodiment of the present application, when the doped target materials comprise one or two of MnO and $MnO_2$, the mass percentage content of the doping material in the doped target material is independently $\leq 10\%$.

In any embodiment of the present application, when the doped target materials comprise one or two of Co and CoO, the mass percentage content of the doping material in the doped target material is independently $\leq 8\%$.

In any embodiment of the present application, when the doped target materials comprise one or more of Li, Cs, Pb, In, Ga, Hg, $Hg_2O$, $Cr_2O_3$, SnO, SnS, PbO, and $Pr_2O_3$, the mass percentage content of the doping material in the doped target material is independently $\leq 25\%$.

In any embodiment of the present application, a hole transport layer has a gradient change in energy level. By adjusting the type and/or content of the inorganic hole transport material and the type and/or content the of doping material of each target material, parameters such as forbidden band width and conduction band bottom energy level of each target material can be conveniently and accurately adjusted, such that the hole transport layer satisfies one or more of the forbidden band width and the conduction band bottom energy level with gradient change in change (e.g. gradient increase or decrease), thereby improving the hole collection and transmission capability of the hole transport layer.

In any embodiment of the present application, the hole transport layer has a gradient change in forbidden band width, the M target materials have gradient changes in forbidden band widths, and the absolute value of the difference between the forbidden band widths of two adjacent target materials, $|\Delta Eg(TAG)|$, satisfies: $0\ eV \leq |\Delta Eg(TAG)| \leq 1.5\ eV$.

In any embodiment of the present application, the hole transport layer has a gradient change in conduction band bottom energy level, the M target materials have gradient changes in conduction band bottom energy levels, and the absolute value of the difference between the conduction band bottom energy levels of two adjacent target materials, $|\Delta CBM(TAG)|$, satisfies: $0\ eV \leq |\Delta CBM(TAG)| \leq 1.5\ eV$.

In any embodiment of the present application, the hole transport layer has a gradient change in forbidden band width and conduction band bottom energy level, the M target materials have gradient changes in forbidden band widths and conduction band bottom energy levels, and the absolute value of the difference between the forbidden band widths of two adjacent target materials, $|\Delta Eg(TAG)|$, satisfies: $0\ eV \leq |\Delta Eg(TAG)| \leq 1.5\ eV$, and the absolute value of the difference between the conduction band bottom energy levels of two adjacent target materials, $|\Delta CBM(TAG)|$, satisfies: $0\ eV \leq |\Delta CBM(TAG)| \leq 1.5\ eV$.

In any embodiment of the present application, the substrate is a transparent electrode, a metal electrode, or a conductive carbon electrode. Optionally, the transparent electrode is an FTO conductive glass electrode or an ITO conductive glass electrode. Optionally, the metal electrode is selected from one or two of a gold electrode, a silver electrode, an aluminum electrode, or a copper electrode.

In any embodiments of the present application, the magnetron sputtering satisfies: a sputtering air pressure is $2\times10^{-3}$ mbar to $8\times10^{-3}$ mbar.

In any embodiments of the present application, the magnetron sputtering satisfies: a gas flow rate is 50 sccm to 250 sccm.

In any embodiments of the present application, the magnetron sputtering satisfies: a heating temperature is 0° C. to 200° C.

In any embodiments of the present application, the magnetron sputtering satisfies: a sputtering power is 200 W to 13 KW.

In any embodiments of the present application, the magnetron sputtering satisfies: a target base spacing is 60 mm to 120 mm.

A second aspect of the present application provides a hole transport layer for a solar cell, at least comprising N consecutive sub-layers, $N\geq 2$, wherein each sub-layer comprises an inorganic hole transport material and at least one of the N sub-layers is a doped sub-layer further comprising a doping material.

The hole transport layer of the present application has a gently-changed energy level gradient, which is beneficial to the energy level matching and optimization between the light absorbing layer/hole transport layer, and is also beneficial to the improvement of the performance of the solar cell. The positions of the forbidden band width, the conduction band bottom energy level, etc. of the hole transport layer of the present application can all be adjusted, which is beneficial to improve the hole collection and transport capacity of the hole transport layer.

In any embodiment of the present application, $2 \leq N \leq 10$.

In any embodiment of the present application, the type of the inorganic hole transport material of each sub-layer is the same as each other.

In any embodiment of the present application, the inorganic hole transport materials are P-type semiconductors.

In any embodiment of the present application, inorganic hole transport materials are selected from one of $NiO_x$, CuO, $Cu_2O$, $Cu_2S$, CuI, CuSCN, $CuGaO_2$, CoO, $Cr_2O_3$, SnO, SnS, $Hg_2O$, PbO, $Ag_2O$, MnO, $MnO_2$, or $Pr_2O_3$. Optionally, the inorganic hole transport materials are selected from $NiO_x$.

In any embodiment of the present application, the type of the doping material of each doped sub-layer is the same as or different from each other.

In any embodiment of the present application, the doping material of each doped sub-layer is independently selected from one or more of $NiO_x$, CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$.

In any embodiment of the present application, the 1st sub-layer or the N-th sub-layer is a doped sub-layer and the doping material at least comprises KI.

In any embodiment of the present application, based on the mass of each doped sub-layer, the total mass percentage content of the doping material of each doped sub-layer is $\leq 25\%$. Optionally, the total mass percentage content of the doping material of each doped sub-layer is 0.1%-25%.

In any embodiment of the present application, when the doped sub-layers comprise one or more of $NiO_x$, CuO, $Cu_2O$, $Cu_2S$, CuI, CuSCN, $CuGaO_2$, Ag, and $Ag_2O$, the mass percentage content of the doping material in the doped sub-layer is independently $\leq 15\%$.

In any embodiment of the present application, when the doped sub-layers comprise one or two of MgO and KI, the mass percentage content of the doping material in the doped sub-layer is independently $\leq 20\%$.

In any embodiment of the present application, when the doped sub-layers comprise one or two of MnO and $MnO_2$, the mass percentage content of the doping material in the doped sub-layer is independently $\leq 10\%$.

In any embodiment of the present application, when the doped sub-layers comprise one or two of Co and CoO, the mass percentage content of the doping material in the doped sub-layer is independently $\leq 8\%$.

In any embodiment of the present application, when the doped sub-layers comprise one or more of Li, Cs, Pb, In, Ga, Hg, $Hg_2O$, $Cr_2O_3$, SnO, SnS, PbO, and $Pr_2O_3$, the mass percentage content of the doping material in the doped sub-layer is independently $\leq 25\%$.

In any embodiment of the present application, N sub-layers have gradient increase or decrease in forbidden band width, and the absolute value of the difference between the forbidden band widths of two adjacent sub-layers, $|\Delta Eg(HTL)|$, satisfies: $0\ eV \leq |\Delta Eg(HTL)| \leq 1.5\ eV$.

In any embodiment of the present application, N sub-layers have gradient increase or decrease in conduction band bottom energy level, and the absolute value of the difference between the conduction band bottom energy levels of two adjacent sub-layers, $|\Delta CBM(HTL)|$, satisfies: $0\ eV \leq |\Delta CBM(HTL)| \leq 1.5\ eV$.

In any embodiment of the present application, N sub-layers have gradient increase or decrease in forbidden band width and conduction band bottom energy level, and the absolute value of the difference between the forbidden band widths of two adjacent sub-layers, $|\Delta Eg(HTL)|$, satisfies: $0 \text{ eV} \leq |\Delta Eg(HTL)| \leq 1.5 \text{ eV}$, and the absolute value of the difference between the conduction band bottom energy levels of two adjacent sub-layers, $|\Delta CBM(HTL)|$, satisfies: $0 \text{ eV} \leq |\Delta CBM(HTL)| \leq 1.5 \text{ eV}$.

In any embodiment of the present application, a hole transport layer has a total thickness of 5 nm to 150 nm. Optionally, the hole transport layer has a total thickness of 10 nm to 80 nm.

A third aspect of the present application provides a solar cell, comprising a hole transport layer prepared by the method according to the first aspect of the present application or a hole transport layer of the second aspect of the present application.

A fourth aspect of the present application provides a preparation method of a solar cell, comprising a method for forming a hole transport layer on the surface of a substrate of the first aspect of the present application.

A fifth aspect of the present application provides a photovoltaic module, comprising a solar cell of the third aspect of the present application.

The solar cell of the present application comprises a hole transport layer having a gently-changed energy level gradient, which is beneficial to the energy level matching and optimization between the light absorbing layer/the hole transport layer, and is beneficial to the improvement of the performance of the solar cell. The positions of the forbidden band width, the conduction band bottom energy level, etc. of the hole transport layer can all be adjusted, which is beneficial to improve the hole collection and transport capacity of the hole transport layer. The photovoltaic module of the present application comprises the solar cell provided by the present application, and therefore at least has the same advantage as the solar cell.

BRIEF DESCRIPTION OF THE DRAWINGS

In order to illustrate the technical solutions of the examples of the present application more clearly, the drawings used in the examples of the present application will be described briefly below. Apparently, the drawings described below are merely some embodiments of the present application, and those of ordinary skill in the art may derive other drawings from these drawings without creative efforts.

DETAILED DESCRIPTION OF EMBODIMENTS

Figure 1:
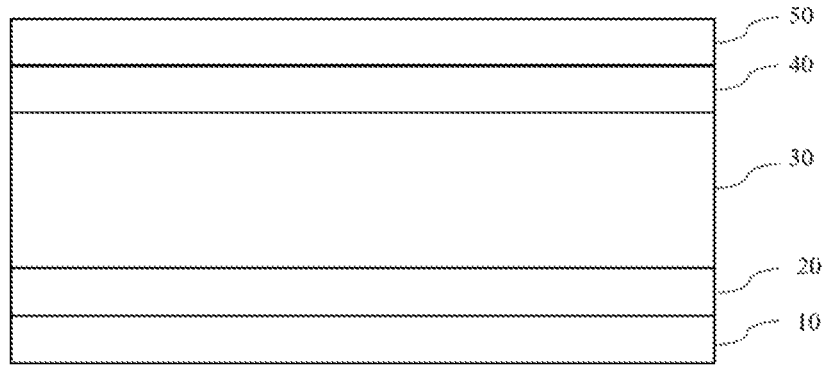
FIG. 1 is a structural schematic diagram of an embodiment of the solar cell of the present application.

Hereinafter, the embodiments of a method for forming a hole transport layer on the surface of a substrate, a hole transport layer, a solar cell and a preparation method therefor, and a photovoltaic module of the present application will be specifically disclosed in detail with reference to the accompanying drawings as appropriate. However, unnecessary detailed illustrations may be omitted in some instances. For example, there are situations where detailed description of well known items and repeated description of actually identical structures are omitted. This to prevent the following description from being unnecessarily verbose, and facilitates understanding by those skilled in the art. Moreover, the accompanying drawings and the descriptions below are provided for enabling those skilled in the art to fully understand the present application, rather than limiting the subject matter disclosed in claims.

"Ranges" disclosed herein are defined in the form of lower and upper limits, where a given range is defined by the selection of a lower limit and an upper limit, and the selected lower and upper limits define the boundaries of the particular range. Ranges defined in this manner may be inclusive or exclusive, and may be arbitrarily combined, that is, any lower limit may be combined with any upper limit to form a range. For example, if the ranges of 60-120 and 80-110 are listed for a particular parameter, it should be understood that the ranges of 60-110 and 80-120 are also contemplated. Additionally, if minimum range values 1 and 2 are listed, and maximum range values 3, 4, and 5 are listed, the following ranges are all contemplated: 1-3, 1-4, 1-5, 2-3, 2-4, and 2-5. In the present application, unless stated otherwise, the numerical range "a-b" denotes an abbreviated representation of any combination of real numbers between a and b, where both a and b are real numbers. For example, the numerical range "0-5" means that all real numbers between "0-5" have been listed herein, and "0-5" is just an abbreviated representation of combinations of these numerical values. In addition, when a parameter is expressed as an integer of $\geq 2$, it is equivalent to disclosing that the parameter is, for example, an integer of 2, 3, 4, 5, 6, 7, 8, 9, 10, 11, 12, and the like.

All the embodiments and optional embodiments of the present application can be combined with one another to form new technical solutions, unless otherwise stated.

All technical features and optional technical features of the present application can be combined with one another to form a new technical solution, unless otherwise stated.

Unless otherwise stated, all the steps of the present application can be performed sequentially or randomly, preferably sequentially. For example, the method including steps (a) and (b) indicates that the method may include steps (a) and (b) performed sequentially, and may also include steps (b) and (a) performed sequentially. For example, reference to "the method may further include step (c)" indicates that step (c) may be added to the method in any order, e.g., the method may include steps (a), (b) and (c), steps (a), (c) and (b), and also steps (c), (a) and (b), etc.

The terms "comprise" and "include" mentioned in the present application are open-ended or closed-ended, unless otherwise stated. For example, "comprise" and "include" may mean that other components not listed may further be comprised or included, or only the listed components may be comprised or included.

In the present application, the term "or" is inclusive unless otherwise specified. For example, the phrase "A or B" means "A, B, or both A and B". More specifically, a condition "A or B" is satisfied by any one of the following: A is true (or present) and B is false (or not present); A is false (or not present) and B is true (or present); or both A and B are true (or present).

As a clean and renewable energy source, solar energy is inexhaustible, so the research of solar energy occupies an important position in energy strategy. As an ideal renewable energy source, solar cells have received more and more attention. At present, the solar cells have been developed from the field of simple lighting to the fields of aerospace, traffic, electric power, communication, portable and wearable integration, and the like.

The stability of solar cells is still a stumbling block to its commercialization. Taking perovskite solar cells as an example, perovskite materials have poor stability in humid environment and light conditions, and are prone to decomposition, resulting in the decrease of energy conversion efficiency or even the failure of solar cells. In order to improve the stability of solar cells, in addition to the dependence on the improvement of the stability of the perovskite materials themselves, another possible solution is to provide a hole transport layer with higher stability and consistency to inhibit the decomposition of perovskite materials.

In order to obtain a hole transport layer with higher stability and consistency, the solution used in the prior art comprises firstly coating to form a film and then annealing at a high temperature to form the hole transport layer. However, the preparation process is complicated, the process window is narrow, the reaction conditions are severe, and the concentration of each component in the reaction solution needs to be accurately controlled. In addition, because this process is a single-piece and single-batch preparation process, each piece needs to be prepared by preparing a reaction solution independently, which makes a poor consistency between different batches. In addition, the preparation process of film-forming by coating further limits the application of large-scale and large-size products.

Method for Forming Hole Transport Layer on Surface of Substrate

In view of the above problems, a first aspect of the embodiments of the present application provides a method for forming a hole transport layer on the surface of a substrate, which can achieve high stability and high consistency of the preparation process, and can further conveniently adjust the energy level structure of the hole transport layer. The method forming a hole transport layer on the surface of a substrate comprises the steps of: providing M target materials comprising inorganic hole transport materials and forming a hole transport layer at least comprising N consecutive sub-layers on the surface of the substrate by using a magnetron sputtering principle, wherein $2 \leq N \leq M$, and at least one of the M target materials is a doped target material further comprising a doping material.

Magnetron sputtering can be performed in a magnetron sputtering chamber, the substrate is installed at an anode of the magnetron sputtering chamber and can be driven forward, and the M target materials are sequentially installed and fixed at a cathode of the magnetron sputtering chamber. In the process of magnetron sputtering, when the substrate is driven forward and passes through a 1st target material, a 1st sub-layer having the same composition as the 1st target material (including types and content of all components) is formed on the surface of the substrate. As the substrate is driven forward, a 2nd sub-layer having the same composition as a 2nd target material is continuously formed on the basis of the 1st sub-layer, and so on until an N-th sub-layer having the same composition as a M-th target material is formed on the basis of an (N−1)-th sub-layer, and $2 \leq N \leq M$.

M>N means that two or more of the target materials adjacent to each other are the same form each other and these target materials together form one of the sub-layers of the hole transport layer. For example, in order to increase the thickness of one of the sub-layers of the hole transport layer, the two adjacent target materials are arranged to be identical.

M=N means that the M target materials correspond to the N sub-layers one by one, that is, the 1st target material is used to form the 1st sub-layer and the 2nd target material is used to form the 2nd sub-layer, and so on.

The inventor of the present application combines inorganic hole transport materials and doping materials to form doped target materials for the first time, each target material is plasmatized by using the magnetron sputtering principle and then sprayed onto a substrate to form a hole transport layer. The method of the present application can also conveniently adjust the specific composition of the target materials or replace the target materials to form the required hole transport layer. Compared with the preparation method of film forming by coating, the method for forming a hole transport layer of the present application is simple, and the obtained hole transport layer has higher stability and consistency.

At least one of the M target materials further comprises a doping material to form a doped target material. In some examples, M−1 target materials in the M target materials comprise a doping material to form a doped target material; the 1st target material in the M target materials does not comprise a doping material, and is used as a non-doped target material. In some other examples, the M target materials all comprise a doping material to form a doped target material.

The method of the present application can conveniently and accurately adjust the composition of each target material according to actual requirements (for example, adjusting types and/or content of inorganic hole transport materials, types and/or content of doping materials, and the like), so as to obtain a hole transport layer with the required energy level.

By adjusting the composition of each target material (for example, adjusting types and/or content of inorganic hole transport materials, types and/or content of doping materials, and the like), the obtained hole transport layer can also have a gently-changed energy level gradient, which is beneficial to the energy level matching and optimization between the light absorbing layer/the hole transport layer, and is beneficial to the improvement of the performance of the solar cell. By adjusting the composition of each target material (for example, adjusting types and/or content of inorganic hole transport materials, types and/or content of doping materials, and the like), parameters such as a forbidden band width and a conduction band bottom energy level of each target material can be conveniently and accurately adjusted, thereby improving the hole collection and transport capacity of the hole transport layer.

The method of the present application can conveniently and accurately adjust the energy level structure of the hole transport layer according to actual requirements, so as to obtain a variety of different hole transport layers, and provide a very wide adjustment window for the performance optimization and design of the hole transport layer; in addition, it can also further expand the performance optimization space of a solar cell and improve the contribution space of the hole transport layer in the performance improvement of the solar cell.

The method of the present application can effectively improve the preparation process window of the hole transport layer, and realize stability and consistency of the process in the batch preparation of the hole transport layer.

The method of the present application can prepare large-scale and large-size hole transport layers.

The method of the present application can realize synchronization of the coating process and the annealing process of the hole transport layer, and reduce the process flow.

The method of the present application can maintain the cleanliness of the obtained hole transport layer, thereby facilitating the improvement of the performance of the solar cell.

The method of the present application does not have problems, such as the safety of organic solvents and environmental protection.

In some examples, N is in a range composed of 2, 3, 4, 5, 6, 7, 8, 9, and 10 or any of these values. Optionally, $2 \leq N \leq 10$, $3 \leq N \leq 10$, $4 \leq N \leq 10$, $5 \leq N \leq 10$, $2 \leq N \leq 9$, $2 \leq N \leq 8$, $2 \leq N \leq 7$, $2 \leq N \leq 6$, $2 \leq N \leq 5$, or $2 \leq N \leq 5$.

In some examples, each target material is introduced into a plasma generating sprayer of a magnetron sputtering chamber in a powdered or wire form, and then sprayed onto the substrate in turn after plasmaization to form a hole transport layer.

In some examples, the M target materials are arranged continuously, at intervals, or partially continuously and partially at intervals.

In some examples, the type of the inorganic hole transport material of each target material is the same as each other.

In some examples, the inorganic hole transport material is a P-type semiconductor. As an example, the inorganic hole transport material is selected from one of nickel oxides $NiO_x$, CuO, $Cu_2O$, $Cu_2S$, CuI, CuSCN, $CuGaO_2$, CoO, $Cr_2O_3$, SnO, SnS, $Hg_2O$, PbO, $Ag_2O$, MnO, $MnO_2$, or $Pr_2O_3$. Optionally, the inorganic hole transport materials are selected from $NiO_x$.

In some examples, the type of the inorganic hole transport material of each doped target material is the same as each other, and the type of the doping material is the same as or different from each other.

For example, in some examples, the type of the inorganic hole transport material of each doped target material is the same as each other, and the type of the doping material is different from each other. In some other examples, the type of the inorganic hole transport material of each doped target material is the same as each other, and the type of the doping material is not exactly the same, for example, at least one identical doping material and at least one different doping material are present in each doped target material.

As an example, the doping material of the each doped target material is independently selected from one or more of $NiO_x$, CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$.

In some examples, based on the mass of each doped target material, the total mass percentage content of the doping material of each doped target material is $\leq 25\%$, for example, $\leq 24\%$, $\leq 23\%$, $\leq 22\%$, $\leq 21\%$, $\leq 20\%$, $\leq 19\%$, $\leq 18\%$, $\leq 17\%$, $\leq 16\%$, $\leq 15\%$, $\leq 14\%$, $\leq 13\%$, $\leq 12\%$, $\leq 11\%$, $\leq 10\%$, $\leq 9\%$, $\leq 8\%$, $\leq 7\%$, $\leq 6\%$, or $\leq 5\%$. Optionally, the total mass percentage content of the doping material in each doped target material is 0.1%-25%, 0.1%-22.5%, 0.1%-20%, 0.1%-17.5%, 0.1%-15%, 0.1%-12.5%, 0.1%-10%, 0.1%-7.5%, or 0.1%-5%.

$NiO_x$, CuO, $Cu_2O$, $Cu_2S$, CuI, CuSCN, $CuGaO_2$, CoO, $Cr_2O_3$, SnO, SnS, $Hg_2O$, PbO, $Ag_2O$, MnO, $MnO_2$, and $Pr_2O_3$ can be used as an inorganic hole transport material and also as a doping material of an inorganic hole transport material. The difference lies in that: as an inorganic hole transport material, the mass percentage content thereof in each target material (or doped target material) is relatively high, for example, greater than 75%, optionally 75%-100%; or as a doping material of an inorganic hole transport material, the mass percentage content thereof in each doped target material is relatively low, for example, $\leq 25\%$.

In some examples, when the doped target materials comprise one or more of $NiO_x$, CuO, $Cu_2O$, $Cu_2S$, CuI, CuSCN, $CuGaO_2$, Ag, and $Ag_2O$, the mass percentage content of the doping material in the doped target material is independently $\leq 15\%$, wherein $NiO_x$, CuO, $Cu_2O$, $Cu_2S$, CuI, CuSCN, $CuGaO_2$, and $Ag_2O$ are herein as a doping material of an inorganic hole transport material in a target material.

In some examples, when the doped target materials comprise one or two of MgO and KI, the mass percentage content of the doping material in the doped target material is independently $\leq 20\%$.

In some examples, when the doped target materials comprise one or two of MnO and $MnO_2$, the mass percentage content of the doping material in the doped target material is independently $\leq 10\%$, wherein MnO and $MnO_2$ are herein as a doping material of an inorganic hole transport material in a target material.

In some examples, when the doped target materials comprise one or two of Co and CoO, the mass percentage content of the doping material in the doped target material is independently $\leq 8\%$, wherein CoO is herein as a doping material of an inorganic hole transport material in a target material.

In some examples, when the doped target materials comprise one or more of Li, Cs, Pb, In, Ga, Hg, $Hg_2O$, $Cr_2O_3$, SnO, SnS, PbO, and $Pr_2O_3$, the mass percentage content of the doping material in the doped target material is independently $\leq 25\%$, wherein $Hg_2O$, $Cr_2O_3$, SnO, SnS, PbO, and $Pr_2O_3$ are herein as a doping material of an inorganic hole transport material in a target material.

By adjusting the type and/or content of the inorganic hole transport material and the type and/or content of the doping material of each target material, the energy level of each target material (for example, forbidden band width, conduction band bottom energy level, etc.) can be obtained.

In order to obtain the required energy level (for example, a forbidden band width, a conduction band bottom energy level, etc.), the type and content of the doping material of each doped target material can be selected from the above-mentioned doping materials and content thereof according to requirements. The doping material can be one or a combination of more.

In some examples, the 1st target material or the M-th target material is a doped target material, and the doping material at least comprises KI, such that the surface defects of the obtained hole transport layer can be reduced to promote subsequent deposition and crystallization of a perovskite material.

In some examples, the hole transport layer has a gradient change in energy level. For example, the hole transport layer satisfies one or more of gradient change in forbidden band width and conduction band bottom energy level. By adjusting the type and/or content of the inorganic hole transport material and the type and/or content the of doping material of each target material, parameters such as forbidden band width and conduction band bottom energy level of each target material can be conveniently and accurately adjusted, such that the hole transport layer satisfies one or more of the forbidden band width and the conduction band bottom energy level with gradient change in change (e.g. gradient increase or decrease), thereby improving the hole collection and transmission capability of the hole transport layer.

As an example, in some examples, the hole transport layer has a gradient change in forbidden band width, the M target materials have gradient changes in forbidden band widths, and the absolute value of the difference between the forbidden band widths of two adjacent target materials, $|\Delta Eg|$ (TAG)|, satisfies: $0\text{ eV} \leq |\Delta Eg(TAG)| \leq 1.5\text{ eV}$. In some other examples, the hole transport layer has a gradient change in conduction band bottom energy level, the M target materials have gradient changes in conduction band bottom energy levels, and the absolute value of the difference between the conduction band bottom energy levels of two adjacent target materials, $|\Delta CBM(TAG)|$, satisfies: $0\text{ eV} \leq |\Delta CBM(TAG)| \leq 1.5\text{ eV}$. In still other examples, the hole transport layer has a gradient change in forbidden band width and conduction band bottom energy level, the M target materials have gradient changes in forbidden band widths and conduction band bottom energy levels, and the absolute value of the difference between the forbidden band widths of two adjacent target materials, $|\Delta Eg(TAG)|$, satisfies: $0\text{ eV} \leq |\Delta Eg(TAG)| \leq 1.5\text{ eV}$, and the absolute value of the difference between the conduction band bottom energy levels of two adjacent target materials, $|\Delta CBM(TAG)|$, satisfies: $0\text{ eV} \leq |\Delta CBM(TAG)| \leq 1.5\text{ eV}$.

In some examples, the magnetron sputtering may be pulsed magnetron sputtering, direct current magnetron sputtering (DC magnetron sputtering), radio frequency magnetron sputtering (RF magnetron sputtering), medium frequency magnetron sputtering, or combined magnetron sputtering.

In some examples, the magnetron sputtering satisfies: a sputtering air pressure is $2 \times 10^{-3}$ mbar to $8 \times 10^{-3}$ mbar.

In some examples, the magnetron sputtering satisfies: a gas flow rate is 50 sccm to 250 sccm.

In some examples, the magnetron sputtering satisfies: a heating temperature is 0° C. to 200° C.

In some examples, the magnetron sputtering satisfies: a sputtering power is 200 W to 13 KW.

In some examples, the magnetron sputtering satisfies: a target base spacing is 60 mm to 120 mm.

In some examples, the magnetron sputtering process can be performed under the following conditions: a sputtering air pressure is $2 \times 10^{-3}$ mbar to $8 \times 10^{-3}$ mbar, a gas flow rate is 50 sccm to 250 sccm, a heating temperature is 0° C. to 200° C., a sputtering power is 200 W to 13 KW, and a target base spacing is 60 mm to 120 mm.

In some examples, the working gas of the magnetron sputtering is selected from one or two of $O_2$ and Ar. Optionally, the volume ratio of $O_2$ to Ar is 1%-90%. The working gas corresponding to each target material during the magnetron sputtering is the same or different, and can be selected according to actual requirements.

The magnetron sputtering conditions corresponding to each target material may be the same or different. For example, in order to increase or reduce the thickness of one of the sub-layers of the hole transport layer, the sputtering power or the sputtering air pressure, etc. of the one target material corresponding to the sub-layer can be individually increased or decreased.

In some examples, the speed at which the substrate is driven forward is 0.1 mm/s to 50 cm/s. The substrate can be driven forward at a uniform speed or can be driven forward at a non-uniform speed. For example, in order to increase or reduce the thickness of one of the sub-layers of the hole transport layer, the rate when the substrate driven forward and passes through the one target material corresponding to the sub-layer can be individually increased or decreased.

In some examples, the heating temperature of the magnetron sputtering is 0° C. to 200° C. When the heating temperature is relatively low, the obtained film can be annealed in air after the magnetron sputtering is completed to eliminate internal stress of the film and make the surface of the film smoother. When the heating temperature is relatively high, the method of the present application can realize synchronization of the coating process and the annealing process, so as to reduce the process flow, wherein the stable temperature of the annealing can be 250° C. to 300° C.

The types of the substrate are not particularly limited in the present application and can be selected according to actual requirements. For example, in some examples, the substrate is a transparent electrode, a metal electrode, or a conductive carbon electrode. Optionally, the transparent electrode is an FTO (fluorine-doped tin dioxide, $SnO_2$:F) conductive glass electrode or an ITO (indium-doped tin dioxide, $SnO_2$:$In_2O_3$) conductive glass electrode. Optionally, the metal electrode is selected from one or more of a gold electrode, a silver electrode, an aluminum electrode, or a copper electrode.

In some examples, the method forming a hole transport layer on the surface of a substrate comprises the steps of: providing M target materials comprising inorganic hole transport materials and forming a hole transport layer at least comprising N consecutive sub-layers on the surface of the substrate by using a magnetron sputtering principle, wherein $2 \leq N \leq M$, and at least one of the M target materials is a doped target material further comprising a doping material; the types of the inorganic hole transport materials of the M target materials are the same as each other and all selected from $NiO_x$; the doping material of the each doped target material is independently selected from one or more of CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$, and based on the mass of each doped target material, the total mass percentage content of the doping material in each doped target material is ≤25%; the obtained hole transport layer has a gradient change in forbidden band width, the M target materials have gradient changes in forbidden band widths, and the absolute value of the difference between the forbidden band widths of two adjacent target materials, $|\Delta Eg(TAG)|$, satisfies: $0\text{ eV} \leq |\Delta Eg(TAG)| \leq 1.5\text{ eV}$.

In some examples, the method forming a hole transport layer on the surface of a substrate comprises the steps of: providing M target materials comprising inorganic hole transport materials and forming a hole transport layer at least comprising N consecutive sub-layers on the surface of the substrate by using a magnetron sputtering principle, wherein $2 \leq N \leq M$, and at least one of the M target materials is a doped target material further comprising a doping material; the types of the inorganic hole transport materials of the M target materials are the same as each other and all selected from $NiO_x$; the doping material of the each doped target material is independently selected from one or more of CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$, and based on the mass of each doped target material, the total mass percentage content of the doping material in each doped target material is ≤25%; the obtained hole transport layer has a gradient change in conduction band bottom energy level, the M target materials have gradient changes in conduction band bottom energy levels, and the absolute value of the difference between the conduction band bottom energy levels of two adjacent target materials, $|\Delta CBM(TAG)|$, satisfies: $0\text{ eV} \leq |\Delta CBM(TAG)| \leq 1.5\text{ eV}$.

In some examples, the method forming a hole transport layer on the surface of a substrate comprises the steps of: providing M target materials comprising inorganic hole transport materials and forming a hole transport layer at least comprising N consecutive sub-layers on the surface of the substrate by using a magnetron sputtering principle, wherein 2≤N≤M, and at least one of the M target materials is a doped target material further comprising a doping material; the types of the inorganic hole transport materials of the M target materials are the same as each other and all selected from $NiO_x$; the doping material of the each doped target material is independently selected from one or more of CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$, and based on the mass of each doped target material, the total mass percentage content of the doping material in each doped target material is ≤25%; the obtained hole transport layer has a gradient change in forbidden band width and conduction band bottom energy level, the M target materials have gradient changes in forbidden band widths and conduction band bottom energy levels, and the absolute value of the difference between the forbidden band widths of two adjacent target materials, |ΔEg(TAG)|, satisfies: 0 eV≤|ΔEg(TAG)|≤1.5 eV, and the absolute value of the difference between the conduction band bottom energy levels of two adjacent target materials, |ΔCBM(TAG)|, satisfies: 0 eV≤|ΔCBM(TAG)|≤1.5 eV.

Hole Transport Layer

A second aspect of the embodiments of the present application provides a hole transport layer for a solar cell. The hole transport layer at least comprises N consecutive sub-layers, N≥2, wherein each sub-layer comprises an inorganic hole transport material and at least one of the N sub-layers is a doped sub-layer further comprising a doping material.

In some examples, N−1 sub-layers in the N sub-layers comprise doping materials and 1 sub-layer does not comprises a doping material. In some other examples, the N sub-layers all comprise doping materials.

In some examples, N is in a range composed of 2, 3, 4, 5, 6, 7, 8, 9, and 10 or any of these values. Optionally, 2≤N≤10, 3≤N≤10, 4≤N≤10, 5≤N≤10, 2≤N≤9, 2≤N≤8, 2≤N≤7, 2≤N≤6, 2≤N≤5, or 2≤N≤5.

In some examples, the type of the inorganic hole transport material of each sub-layer is the same as each other.

In some examples, the inorganic hole transport material is a P-type semiconductor. As an example, the inorganic hole transport material is selected from one of nickel oxides $NiO_x$, CuO, $Cu_2O$, $Cu_2S$, CuI, CuSCN, $CuGaO_2$, CoO, $Cr_2O_3$, SnO, SnS, $Hg_2O$, PbO, $Ag_2O$, MnO, $MnO_2$, or $Pr_2O_3$. Optionally, the inorganic hole transport materials are selected from $NiO_x$.

In some examples, the type of the inorganic hole transport material of each doped sub-layer is the same as each other, and the type of the doping material is the same as or different from each other.

For example, in some examples, the type of the inorganic hole transport material of each doped sub-layer is the same as each other, and the type of the doping material is different from each other. In some other examples, the type of the inorganic hole transport material of each doped sub-layer is the same as each other, and the type of the doping material is not exactly the same, for example, at least one identical doping material and at least one different doping material are present in each doped sub-layer.

As an example, the doping material of each doped sub-layer is independently selected from one or more of $NiO_x$, CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$.

In some examples, based on the mass of each doped sub-layer, the total mass percentage content of the doping material in each doped sub-layer is ≤25%, for example, ≤24%, ≤23%, ≤22%, ≤21%, ≤20%, ≤19%, ≤18%, ≤17%, ≤16%, ≤15%, ≤14%, ≤13%, ≤12%, ≤11%, ≤10%, ≤9%, ≤8%, ≤7%, ≤6%, or ≤5%. Optionally, the total mass percentage content of the doping material in each doped sub-layer is 0.1%-25%, 0.1%-22.5%, 0.1%-20%, 0.1%-17.5%, 0.1%-15%, 0.1%-12.5%, 0.1%-10%, 0.1%-7.5%, or 0.1%-5%.

$NiO_x$, CuO, $Cu_2O$, $Cu_2S$, CuI, CuSCN, $CuGaO_2$, CoO, $Cr_2O_3$, SnO, SnS, $Hg_2O$, PbO, $Ag_2O$, MnO, $MnO_2$, and $Pr_2O_3$ can be used as an inorganic hole transport material and also as a doping material of an inorganic hole transport material. The difference lies in that: As an inorganic hole transport material, the mass percentage content thereof in each sub-layer (or doped sub-layer) is relatively high, for example, greater than 75%, optionally 75%-100%; or as a doping material of an inorganic hole transport material, the mass percentage content thereof in each doped sub-layer is relatively low, for example, ≤25%.

In some examples, when the doped sub-layers comprise one or more of $NiO_x$, CuO, $Cu_2O$, $Cu_2S$, CuI, CuSCN, $CuGaO_2$, Ag, and $Ag_2O$, the mass percentage content of the doping material in the doped sub-layer is independently ≤15%, wherein $NiO_x$, CuO, $Cu_2O$, $Cu_2S$, CuI, CuSCN, $CuGaO_2$, and $Ag_2O$ are herein as a doping material of an inorganic hole transport material in a doped sub-layer.

In some examples, when the doped sub-layers comprise one or two of MgO and KI, the mass percentage content of the doping material in the doped sub-layer is independently ≤20%.

In some examples, when the doped sub-layers comprise one or two of MnO and $MnO_2$, the mass percentage content of the doping material in the doped sub-layer is independently ≤10%, wherein MnO and $MnO_2$ are herein as a doping material of an inorganic hole transport material in a doped sub-layer.

In some examples, when the doped sub-layers comprise one or two of Co and CoO, the mass percentage content of the doping material in the doped sub-layer is independently ≤8%, wherein CoO is herein as a doping material of an inorganic hole transport material in a doped sub-layer.

In some examples, when the doped sub-layers comprise one or more of Li, Cs, Pb, In, Ga, Hg, $Hg_2O$, $Cr_2O_3$, SnO, SnS, PbO, and $Pr_2O_3$, the mass percentage content of the doping material in the doped sub-layer is independently ≤25%, wherein $Hg_2O$, $Cr_2O_3$, SnO, SnS, PbO, and $Pr_2O_3$ are herein as a doping material of an inorganic hole transport material in a doped sub-layer.

By adjusting the type and/or content of the inorganic hole transport material and the type and/or content of the doping material of each sub-layer, the energy level of each sub-layer (for example, forbidden band width, conduction band bottom energy level, etc.) can be obtained.

In order to obtain the required energy level (for example, a forbidden band width, a conduction band bottom energy level, etc.), the type and content of the doping material of each doped sub-layer can be selected from the above-mentioned doping materials and content thereof according to requirements. The doping material can be one or a combination of more.

In some examples, the 1st sub-layer or the N-th sub-layer is a doped sub-layer, and the doping material at least comprises KI, such that the surface defects of the hole transport layer can be reduced to promote subsequent deposition and crystallization of a perovskite material.

In some examples, the N sub-layers have gradient changes in energy levels. For example, the N sub-layers satisfy one or more of forbidden band width and conduction band bottom energy level with gradient changes. By adjusting type and/or content of the inorganic hole transport material and type and/or content of the doping material of each sub-layer, the positions of the energy levels of each sub-layer and the hole transport layer (for example, forbidden band width, conduction band bottom energy level, etc.) can be adjusted, such that the energy level matching and optimization between the light absorbing layer/the hole transport layer are better realized.

For example, in some examples, the N sub-layers have gradient increase or decrease in forbidden band width, and the absolute value of the difference between the forbidden band widths of two adjacent sub-layers, |ΔEg(HTL)|, satisfies: 0 eV≤|ΔEg(HTL)|≤1.5 eV. In some other examples, the N sub-layers have gradient increase or decrease in conduction band bottom energy level, and the absolute value of the difference between the conduction band bottom energy levels of two adjacent sub-layers, |ΔCBM(HTL)|, satisfies: 0 eV≤|ΔCBM(HTL)|≤1.5 eV. In still other examples, the N sub-layers have gradient increase or decrease in forbidden band width and conduction band bottom energy level, and the absolute value of the difference between the forbidden band widths of two adjacent sub-layers, |ΔEg(HTL)|, satisfies: 0 eV≤|ΔEg(HTL)| ≤1.5 eV, and the absolute value of the difference between the conduction band bottom energy levels of two adjacent sub-layers, |ΔCBM(HTL)|, satisfies: 0 eV≤|ΔCBM(HTL)|≤1.5 eV.

The hole transport layer of the present application has a gently-changed energy level gradient, which is beneficial to the energy level matching and optimization between the light absorbing layer/hole transport layer, and is also beneficial to the improvement of the performance of the solar cell. The positions of the forbidden band width, the conduction band bottom energy level, etc. of the hole transport layer of the present application can all be adjusted, which is beneficial to improve the hole collection and transport capacity of the hole transport layer.

In some examples, the hole transport layer has a total thickness of 5 nm to 150 nm. Optionally, the hole transport layer has a total thickness of 10 nm to 80 nm, wherein the thickness of each sub-layer is the same as or different.

The energy band distribution of each sub-layer and the hole transport layer can be obtained by using X-ray photoelectron spectroscopy (XPS) or ultraviolet photoelectron spectroscopy (UPS).

In some examples, the hole transport layer at least comprises N consecutive sub-layers, 2≤N≤10, wherein each sub-layer comprises an inorganic hole transport material and at least one of the N sub-layers is a doped sub-layer further comprising a doping material; the types of the inorganic hole transport materials of the N sub-layers are the same as each other and all selected from $NiO_x$; the doping material of the each doped sub-layer is independently selected from one or more of CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$, and based on the mass of each doped sub-layer, the total mass percentage content of the doping material in each doped sub-layer is ≤25%; the N sub-layers have gradient increase or decrease in forbidden band width, and the absolute value of the difference between the forbidden band widths of two adjacent sub-layers, |ΔEg(HTL)|, satisfies: 0 eV≤|ΔEg(HTL)|≤1.5 eV.

In some examples, the hole transport layer at least comprises N consecutive sub-layers, 2≤N≤10, wherein each sub-layer comprises an inorganic hole transport material and at least one of the N sub-layers is a doped sub-layer further comprising a doping material; the types of the inorganic hole transport materials of the N sub-layers are the same as each other and all selected from $NiO_x$; the doping material of the each doped sub-layer is independently selected from one or more of CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$, and based on the mass of each doped sub-layer, the total mass percentage content of the doping material in each doped sub-layer is ≤25%; the N sub-layers have gradient increase or decrease in conduction band bottom energy level, and the absolute value of the difference between the conduction band bottom energy levels of two adjacent sub-layers, |ΔCBM(HTL)|, satisfies: 0 eV≤|ΔCBM(HTL)| ≤1.5 eV.

In some examples, the hole transport layer at least comprises N consecutive sub-layers, 2≤N≤10, wherein each sub-layer comprises an inorganic hole transport material and at least one of the N sub-layers is a doped sub-layer further comprising a doping material; the types of the inorganic hole transport materials of the N sub-layers are the same as each other and all selected from $NiO_x$; the doping material of the each doped sub-layer is independently selected from one or more of CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$, and based on the mass of each doped sub-layer, the total mass percentage content of the doping material in each doped sub-layer is ≤25%; the N sub-layers have gradient increase or decrease in forbidden band width and conduction band bottom energy level, and the absolute value of the difference between the forbidden band widths of two adjacent sub-layers, |ΔEg(HTL)|, satisfies: 0 eV<|ΔEg(HTL)|≤1.5 eV, and the absolute value of the difference between the conduction band bottom energy levels of two adjacent sub-layers, |ΔCBM(HTL)|, satisfies: 0 eV<|ΔCBM(HTL)|≤1.5 eV.

Solar Cell

A third aspect of the embodiments of the present application provides a solar cell, comprising a hole transport layer prepared by the method according to a first aspect of the embodiments of the present application or a hole transport layer of a second aspect of the embodiments of the present application.

The solar cell of the present application further comprises a front electrode, a back electrode, a light absorbing layer, and an electron transport layer. The hole transport layer, the light absorbing layer, and the electron transport layer are located between the front electrode and the back electrode, and the light absorbing layer is located between the electron transport layer and the hole transport layer.

Next, the solar cell according to the third aspect of the embodiments of the present application will be described with reference to the accompanying drawings.

Figure 2:
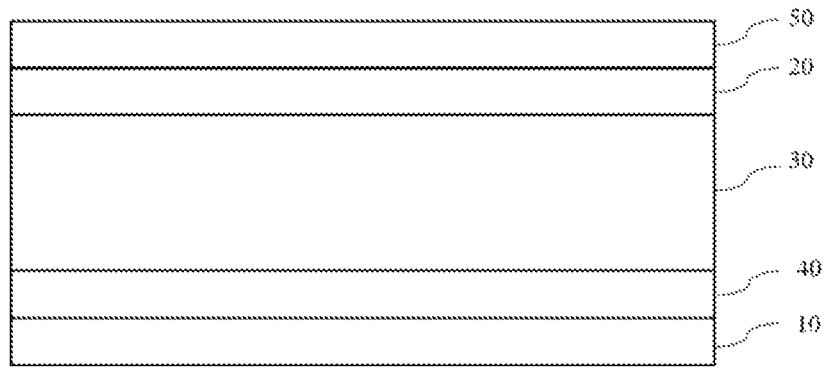
FIG. 2 is a structural schematic diagram of another embodiment of the solar cell of the present application.

FIG. 1 is a structural schematic diagram of an embodiment of the solar cell of the present application. As shown in FIG. 1, the solar cell comprises a front electrode 10, a hole transport layer 20, a light absorbing layer 30, an electron transport layer 40, and a back electrode 50 which are sequentially arranged. FIG. 2 is a structural schematic diagram of another embodiment of the solar cell of the present application. As shown in FIG. 2, the solar cell comprises a front electrode 10, an electronic transport layer 40, a light absorbing layer 30, a hole transport layer 20, and a back electrode 50 which are sequentially arranged. The hole transport layer 20 comprises N consecutive sub-layers, N≥2, each sub-layer comprises an inorganic hole transport material, and at least one of the N sub-layers is a doped sub-layer further comprising a doping material. The 1st sub-layer is arranged away from the light absorbing layer 30 and the N-th sub-layer is arranged close to the light absorbing layer 30.

In some examples, N−1 sub-layers in the N sub-layers comprise doping materials and 1 sub-layer does not comprises a doping material. In some other examples, the N sub-layers all comprise doping materials.

In some examples, N is in a range composed of 2, 3, 4, 5, 6, 7, 8, 9, and 10 or any of these values. Optionally, 2≤N≤10, 3≤N≤10, 4≤N≤10, 5≤N≤10, 2≤N≤9, 2≤N≤8, 2≤N≤7, 2≤N≤6, 2≤N≤5, or 2≤N≤5.

In some examples, the type of the inorganic hole transport material of each sub-layer is the same as each other.

In some examples, the inorganic hole transport material is a P-type semiconductor. As an example, the inorganic hole transport material is selected from one of nickel oxides $NiO_x$, CuO, $Cu_2O$, $Cu_2S$, CuI, CuSCN, $CuGaO_2$, CoO, $Cr_2O_3$, SnO, SnS, $Hg_2O$, PbO, $Ag_2O$, MnO, $MnO_2$, or $Pr_2O_3$. Optionally, the inorganic hole transport material is selected from $NiO_x$.

In some examples, the type of the inorganic hole transport material of each doped sub-layer is the same as each other, and the type of the doping material is the same as or different from each other.

For example, in some examples, the type of the inorganic hole transport material of each doped sub-layer is the same as each other, and the type of the doping material is different from each other. In some other examples, the type of the inorganic hole transport material of each doped sub-layer is the same as each other, and the type of the doping material is not exactly the same, for example, at least one identical doping material and at least one different doping material are present in each doped sub-layer.

As an example, the doping material of each doped sub-layer is independently selected from one or more of $NiO_x$, CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$.

In some examples, based on the mass of each doped sub-layer, the total mass percentage content of the doping material in each doped sub-layer is ≤25%, for example, ≤24%, ≤23%, ≤22%, ≤21%, ≤20%, ≤19%, ≤18%, ≤17%, ≤16%, ≤15%, ≤14%, ≤13%, ≤12%, ≤11%, ≤10%, ≤9%, ≤8%, ≤7%, ≤6%, or ≤5%. Optionally, the total mass percentage content of the doping material in each doped sub-layer is 0.1%-25%, 0.1%-22.5%, 0.1%-20%, 0.1%-17.5%, 0.1%-15%, 0.1%-12.5%, 0.1%-10%, 0.1%-7.5%, or 0.1%-5%.

$NiO_x$, CuO, $Cu_2O$, $Cu_2S$, CuI, CuSCN, $CuGaO_2$, CoO, $Cr_2O_3$, SnO, SnS, $Hg_2O$, PbO, $Ag_2O$, MnO, $MnO_2$, and $Pr_2O_3$ can be used as an inorganic hole transport material and also as a doping material of an inorganic hole transport material. The difference lies in that: As an inorganic hole transport material, the mass percentage content thereof in each sub-layer (or doped sub-layer) is relatively high, for example, greater than 75%, optionally 75%-100%; or as a doping material of an inorganic hole transport material, the mass percentage content thereof in each doped sub-layer is relatively low, for example, ≤25%.

In some examples, when the doped sub-layers comprise one or more of $NiO_x$, CuO, $Cu_2O$, $Cu_2S$, CuI, CuSCN, $CuGaO_2$, Ag, and $Ag_2O$, the mass percentage content of the doping material in the doped sub-layer is independently ≤15%, wherein $NiO_x$, CuO, $Cu_2O$, $Cu_2S$, CuI, CuSCN, $CuGaO_2$, and $Ag_2O$ are herein as a doping material of an inorganic hole transport material in a doped sub-layer.

In some examples, when the doped sub-layers comprise one or two of MgO and KI, the mass percentage content of the doping material in the doped sub-layer is independently ≤20%.

In some examples, when the doped sub-layers comprise one or two of MnO and $MnO_2$, the mass percentage content of the doping material in the doped sub-layer is independently ≤10%, wherein MnO and $MnO_2$ are herein as a doping material of an inorganic hole transport material in a doped sub-layer.

In some examples, when the doped sub-layers comprise one or two of Co and CoO, the mass percentage content of the doping material in the doped sub-layer is independently ≤8%, wherein CoO is herein as a doping material of an inorganic hole transport material in a doped sub-layer.

In some examples, when the doped sub-layers comprise one or more of Li, Cs, Pb, In, Ga, Hg, $Hg_2O$, $Cr_2O_3$, SnO, SnS, PbO, and $Pr_2O_3$, the mass percentage content of the doping material in the doped sub-layer is independently ≤25%, wherein $Hg_2O$, $Cr_2O_3$, SnO, SnS, PbO, and $Pr_2O_3$ are herein as a doping material of an inorganic hole transport material in a doped sub-layer.

By adjusting the type and/or content of the inorganic hole transport material and the type and/or content of the doping material of each sub-layer, the energy level of each sub-layer (for example, forbidden band width, conduction band bottom energy level, etc.) can be obtained.

In order to obtain the required energy level (for example, a forbidden band width, a conduction band bottom energy level, etc.), the type and content of the doping material of each doped sub-layer can be selected from the above-mentioned doping materials and content thereof according to requirements. The doping material can be one or a combination of more.

In some examples, the N-th sub-layer is a doped sub-layer, and the doping material at least comprises KI, such that the surface defects of the hole transport layer can be reduced to promote subsequent deposition and crystallization of a perovskite material.

In some examples, the N sub-layers have gradient changes in energy levels. For example, the N sub-layers satisfy one or more of forbidden band width and conduction band bottom energy level with gradient changes. By adjusting type and/or content of the inorganic hole transport material and type and/or content of the doping material of each sub-layer, the positions of the energy levels of each sub-layer and the hole transport layer (for example, forbidden band width, conduction band bottom energy level, etc.) can be adjusted, such that the energy level matching and optimization between the light absorbing layer/the hole transport layer are better realized.

In some examples, along the direction from the N-th sub-layer to the 1st sub-layer, the N sub-layers have gradient increase in forbidden band width, and the absolute value of the difference between the forbidden band widths of two adjacent sub-layers, |ΔEg(HTL)|, satisfies: 0 eV≤|ΔEg(HTL)|≤1.5 eV. In some other examples, along the direction from the N-th sub-layer to the 1st sub-layer, the N sub-layers have gradient increase in conduction band bottom energy level, and the absolute value of the difference between the conduction band bottom energy levels of two adjacent sub-layers, |ΔCBM(HTL)|, satisfies: 0 eV≤|ΔCBM(HTL)|≤1.5 eV. In still other examples, along the direction from the N-th sub-layer to the 1st sub-layer, the N sub-layers have gradient increase in forbidden band width and conduction band bottom energy level, and the absolute value of the difference between the forbidden band widths of two adjacent sub-layers, |ΔEg(HTL)|, satisfies: 0 eV≤|ΔEg(HTL)|≤1.5 eV, and the absolute value of the difference between the conduction band bottom energy levels of two adjacent sub-layers, |ΔCBM(HTL)|, satisfies: 0 eV≤|ΔCBM(HTL)|≤1.5 eV.

Specifically, the 1st sub-layer has a conduction band bottom energy level $CBM_1$, a valence band top energy level $VBM_1$, and a forbidden band width $\Delta Eg_1 = CBM_1 - VBM_1$; the 2nd sub-layer has a conduction band bottom energy level $CBM_2$, a valence band top energy level $VBM_2$, and a forbidden band width $\Delta Eg_2 = CBM_2 - VBM_2$; . . . , and the N-th sub-layer has a conduction band bottom energy level $CBM_n$, a valence band top energy level $VBM_n$, and a forbidden band width $\Delta Eg_n = CBM_n - VBM_n$.

In some examples, $\Delta Eg_1$, $\Delta Eg_2$ . . . $\Delta Eg_n$ decreases in sequence, and 0 eV<$\Delta Eg_i$-$\Delta Eg_{i+1}$≤1.5 eV, 1≤i≤N-1. In some other examples, $CBM_1$, $CBM_2$ . . . $CBM_n$ decreases in sequence, and 0 eV<$CBM_i$-$CBM_{i+1}$≤1.5 eV, 1≤i≤N-1. In still other examples, $\Delta Eg_1$, $\Delta Eg_2$, . . . , $\Delta Eg_n$ decreases in sequence, $CBM_1$, $CBM_2$, . . . , $CBM_n$ decreases in sequence, and 0 eV<$\Delta Eg_i$-$\Delta Eg_{i+1}$≤1.5 eV, 0 eV<$CBM_i$-$CBM_{i+1}$≤1.5 eV, 1≤i≤N-1.

The solar cell of the present application comprises a hole transport layer having a gently-changed energy level gradient, which is beneficial to the energy level matching and optimization between the light absorbing layer/the hole transport layer, and is beneficial to the improvement of the performance of the solar cell. The positions of the forbidden band width, the conduction band bottom energy level, etc. of the hole transport layer can all be adjusted, which is beneficial to improve the hole collection and transport capacity of the hole transport layer.

In some examples, the hole transport layer 20 has a total thickness of 5 nm to 150 nm. Optionally, the hole transport layer 20 has a total thickness of 10 nm to 80 nm, wherein the thickness of each sub-layer in the hole transport layer 20 is the same or different.

In other examples, the light absorbing layer 30 comprises a perovskite material. As an intrinsic semiconductor material, the perovskite material can transport electrons and holes, and therefore, it can be used as a light absorbing layer, an electron transport layer or a hole transport layer in a solar cell. The type of the perovskite material is not particularly limited and may be selected according to actual requirements. In some embodiments, the perovskite material may comprise one or more of an inorganic halide perovskite material, an organic halide perovskite material, and an organic-inorganic hybrid halide perovskite material. The molecular formula of the perovskite material can be $ABX_3$, wherein A represents an inorganic cation, an organic cation, or an organic-inorganic mixed cation, B represents an inorganic cation, an organic cation, or an organic-inorganic mixed cation, and X represents an inorganic anion, an organic anion, or an organic-inorganic mixed anion.

As an example, A is selected from one or more of $CH_3NH_3^+$ ($MA^+$), $CH(NH_2)_2^+$($FA^+$), $Li^+$, $Na^+$, $K^+$, $Rb^+$, or $Cs^+$. Optionally, A is selected from one or more of $CH_3NH_3^+$, $CH(NH_2)_2^+$, or $Cs^+$.

As an example, B is selected from one or more of $Pb^{2+}$, $Sn^{2+}$, $Be^{2+}$, $Mg^{2+}$, $Ca^{2+}$, $Sr^{2+}$, $Ba^{2+}$, $Zn^{2+}$, $Ge^{2+}$, $Fe^{2+}$, $Co^{2+}$, or $Ni^{2+}$. Optionally, B is selected from one or more of $Pb^{2+}$ or $Sn^{2+}$.

As an example, X is selected from one or more of $F^-$, $Cl^-$, $Br^-$, or $I^-$. Optionally, X is selected from one or more of $Cl^-$, $Br^-$, or $I^-$.

In some examples, the perovskite material includes but is not limited to one or more of $CH_3NH_3PbI_3$($MAPbI_3$), $CH(NH_2)_2PbI_3$($FAPbI_3$), $CsPbI_3$, $CsPbI_2Br$, and $CsPbIBr_2$.

In some examples, the thickness of the light absorbing layer 30 is not specifically limited and can be selected according to actual requirements. For example, the light absorbing layer 30 has a thickness of 150 nm to 1,000 nm. Optionally, the light absorbing layer 30 has a thickness of 300 nm to 700 nm.

In some examples, the electron transport layer 40 comprises an electron transport material. The electron transport material of the electron transport layer 40 is not particularly limited and may be selected according to actual requirements. For example, the electron transport material is selected from an organic electron transport material, an inorganic electron transport material, or an organic-inorganic hybrid electron transport material.

As an example, the electron transport material is selected from at least one of the following materials: an imide compound, a quinone compound, fullerene and a derivative thereof, 2,2',7,7'-tetra(N,N-p-methoxyanilino)-9,9'-spirobifluorene (Spiro-OMeTAD), methoxytriphenylamine-fluoroformamidine (OMeTPA-FA), poly(3,4-ethylenedioxythiophene):polystyrene sulfonic acid (PEDOT:PSS), poly-3-hexylthiophene (P3HT), triptycene-cored triphenylamine (H101), 3,4-ethylenedioxythiophene-methoxytriphenylamine (EDOT-OMeTPA), N-(4-aniline)carbazole-spirobifluorene (CzPAF-SBF), polythiophene, metal oxides (metal elements are selected from Mg, Ni, Cd, Zn, In, Pb, Mo, W, Sb, Bi, Cu, Hg, Ti, Ag, Mn, Fe, V, Sn, Zr, Sr, Ga, or Cr), silicon oxide ($SiO_2$), strontium titanate ($SrTiO_3$), calcium titanate ($CaTiO_3$), lithium fluoride (LiF), calcium fluoride ($CaF_2$), or cuprous thiocyanate (CuSCN).

Optionally, the electron transport material is selected from one or more of fullerene and a derivative thereof. For example, the electron transport material is selected from one or more of $PC_{60}BM$ or $PC_{70}BM$. The energy levels of the fullerene and a derivative thereof can be better matched with the energy level of the light absorbing layer, which is beneficial to facilitate the extraction and transport of electrons.

In some examples, the thickness of the electron transport layer 40 is not specifically limited and can be selected according to actual requirements. For example, the electron transport layer 40 has a thickness of 20 nm to 200 nm.

In some examples, at least one of the front electrode 10 and the back electrode 50 is a transparent electrode. As an example, the transparent electrode is an FTO (fluorine-doped tin dioxide, $SnO_2$:F) conductive glass electrode or an ITO (indium-doped tin dioxide, $SnO_2$:$In_2O_3$) conductive glass electrode.

In some examples, one of the front electrode 10 and the back electrode 50 is a metal electrode, or a conductive carbon electrode. As an example, the metal electrode is selected from one or more of a gold electrode, a silver electrode, an aluminum electrode, or a copper electrode.

In some examples, the thickness of the front electrode 10 is not specifically limited and can be selected according to actual requirements. For example, the thickness of the front electrode 10 is 10 nm to 650 nm.

In some examples, the thickness of the back electrode 50 is not specifically limited and can be selected according to actual requirements. For example, the back electrode 50 has a thickness of 10 nm to 650 nm.

The solar cell of the present application is not limited to the above structure and may also comprise other functional layers. For example, in some examples, the solar cell further comprises a hole blocking layer between the light absorbing layer 30 and the electron transport layer 40. In some other examples, the solar cell further comprises an electrode modification layer for modifying the front electrode 10 or the back electrode 50, and the electrode modification layer can reduce the energy level potential barrier between the light absorbing layer 30 and the front electrode 10 or the back electrode 50, and play a role of transporting holes to block electrons or transporting electrons to block holes.

The energy band distribution of each film layer can be obtained by using X-ray photoelectron spectroscopy (XPS) or ultraviolet photoelectron spectroscopy (UPS).

In some examples, a solar cell comprises a front electrode, a back electrode, a hole transport layer, a light absorbing layer, and an electron transport layer, wherein the hole transport layer, the light absorbing layer, and the electron transport layer are located between the front electrode and the back electrode, the light absorbing layer is located between the electron transport layer and the hole transport layer, the hole transport layer comprises N consecutive sub-layers, $2 \leq N \leq 10$, each sub-layer comprises an inorganic hole transport material, and at least one of the N sub-layers is a doped sub-layer further comprising a doping material; the types of the inorganic hole transport materials of the N sub-layers are the same as each other and all selected from $NiO_x$; the doping material of the each doped sub-layer is independently selected from one or more of CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$, and based on the mass of each doped sub-layer, the total mass percentage content of the doping material in each doped sub-layer is ≤25%; the 1st sub-layer is arranged away from the light absorbing layer, and the N-th sub-layer is arranged close to the light absorbing layer; along the direction from the N-th sub-layer to the 1st sub-layer, the N sub-layers have gradient increase in forbidden band width, and the absolute value of the difference between the forbidden band widths of two adjacent sub-layers, $|\Delta Eg(HTL)|$, satisfies: $0 \text{ eV} \leq |\Delta Eg(HTL)| \leq 1.5$ eV.

In some examples, a solar cell comprises a front electrode, a back electrode, a hole transport layer, a light absorbing layer, and an electron transport layer, wherein the hole transport layer, the light absorbing layer, and the electron transport layer are located between the front electrode and the back electrode, the light absorbing layer is located between the electron transport layer and the hole transport layer, the hole transport layer comprises N consecutive sub-layers, $2 \leq N \leq 10$, each sub-layer comprises an inorganic hole transport material, and at least one of the N sub-layers is a doped sub-layer further comprising a doping material; the types of the inorganic hole transport materials of the N sub-layers are the same as each other and all selected from $NiO_x$; the doping material of the each doped sub-layer is independently selected from one or more of CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$, and based on the mass of each doped sub-layer, the total mass percentage content of the doping material in each doped sub-layer is ≤25%; the 1st sub-layer is arranged away from the light absorbing layer, and the N-th sub-layer is arranged close to the light absorbing layer; along the direction from the N-th sub-layer to the 1st sub-layer, the N sub-layers have gradient increase in conduction band bottom energy level, and the absolute value of the difference between the conduction band bottom energy levels of two adjacent sub-layers, $|\Delta CBM(HTL)|$, satisfies: $0 \text{ eV} \leq |\Delta CBM(HTL)| \leq 1.5$ eV.

In some examples, a solar cell comprises a front electrode, a back electrode, a hole transport layer, a light absorbing layer, and an electron transport layer, wherein the hole transport layer, the light absorbing layer, and the electron transport layer are located between the front electrode and the back electrode, the light absorbing layer is located between the electron transport layer and the hole transport layer, the hole transport layer comprises N consecutive sub-layers, $2 \leq N \leq 10$, each sub-layer comprises an inorganic hole transport material, and at least one of the N sub-layers is a doped sub-layer further comprising a doping material; the types of the inorganic hole transport materials of the N sub-layers are the same as each other and all selected from $NiO_x$; the doping material of the each doped sub-layer is independently selected from one or more of CuO, $Cu_2O$, $Cu_2S$, CuI, CuSCN, $CuGaO_2$, MgO, MnO, $MnO_2$, Ag, $Ag_2O$, Co, CoO, KI, Li, Cs, Pb, In, Ga, Hg, $Hg_2O$, $Cr_2O_3$, SnO, SnS, PbO, or $Pr_2O_3$, and based on the mass of each doped sub-layer, the total mass percentage content of the doping material in each doped sub-layer is ≤25%; the 1st sub-layer is arranged away from the light absorbing layer, and the N-th sub-layer is arranged close to the light absorbing layer; along the direction from the N-th sub-layer to the 1st sub-layer, the N sub-layers have gradient increase in forbidden band width and conduction band bottom energy level, and the absolute value of the difference between the forbidden band widths of two adjacent sub-layers, $|\Delta Eg(HTL)|$, satisfies: $0 \text{ eV} \leq |\Delta Eg(HTL)| \leq 1.5$ eV, and the absolute value of the difference between the conduction band bottom energy levels of two adjacent sub-layers, $|\Delta CBM(HTL)|$, satisfies: $0 \text{ eV} \leq |\Delta CBM(HTL)| \leq 1.5$ eV.

Preparation Method of Solar Cell

A fourth aspect of the embodiments of the present application provides a preparation method of a solar cell, at least comprising a step for forming a hole transport layer on the surface of a substrate according to the first aspect of the embodiments of the present application.

The preparation method of the solar cell of the present application further comprises the steps of: preparing a front electrode; preparing a light absorbing layer; preparing an electron transport layer; and preparing a back electrode. The film-formation method of each of the above-mentioned film layers is not particularly limited, and film forming methods known in the art can be used, for example, the above-mentioned film layers can be grown by using any solution method, vacuum evaporation method, chemical vapor deposition method, sputtering method, etc.

In some examples, the preparation method of the solar cell of the present application comprises the steps of: preparing a front electrode, forming a hole transport layer on the front electrode according to a method of the first aspect of the embodiments of the present application, forming a light absorbing layer on the hole transport layer, forming an electron transport layer on the light absorbing layer, and forming a back electrode on the electron transport layer.

In some examples, the preparation method of the solar cell of the present application comprises the steps of: preparing a front electrode, forming a hole transport layer on the front electrode, forming a light absorbing layer on the hole transport layer, forming an electron transport layer on the light absorbing layer according to a method of the first aspect of the embodiments of the present application, and forming a back electrode on the electron transport layer.

The energy band distribution of each film layer can be obtained by using X-ray photoelectron spectroscopy (XPS) or ultraviolet photoelectron spectroscopy (UPS).

Photovoltaic Module

A fifth aspect of the embodiments the present application provides a photovoltaic module, comprising a solar cell of the third aspect of the embodiments of the present application, and the solar cell can be used as a power source for the photovoltaic module.

EXAMPLES

The following examples more specifically describe the content disclosed in the present application, and these examples are only used for explanatory description, because various modifications and changes within the scope of the present disclosure are obvious to those skilled in the art. Unless otherwise noted, all parts, percentages, and ratios reported in the following examples are on a mass basis, and all reagents used in the examples are commercially available and used directly without further treatment, and the instruments used in the examples are commercially available.

Example 1

Preparation of ITO Conductive Glass Electrode

An ITO conductive glass with a specification of 2.0 cm×2.0 cm. The surface of the ITO conductive glass is washed with acetone and isopropanol for 2 times in turn respectively, which is then soaked into deionized water for ultrasonic treatment for 10 min and dried in a blast drying oven.

Preparation of Hole Transport Layer 4 target materials are prepared according to the composition shown in Table 1, numbered 1 #, 2 #, 3 #, 4 #, . . . , which are sequentially installed and fixed on the cathode of the magnetron sputtering chamber, and magnetron sputtering conditions of each target material are set according to Table 2; the obtained ITO conductive glass is placed on an anode of the magnetron sputtering chamber as a substrate, and the speed at which the substrate is driven forward is 4.5 mm/s.

In the process of magnetron sputtering, when the ITO conductive glass is driven forward and passes through a 1 #target material, a 1 #sub-layer having the same composition as the 1 #target material will be formed on the surface of the ITO conductive glass; as the ITO conductive glass is driven forward, a 2 #sub-layer with the same composition as a 2 #target material will be formed continuously on the basis of the 1 #sub-layer, and so on.

After the magnetron sputtering, a hole transport layer with 4 sub-layers is obtained on the surface of the ITO conductive glass electrode, and the total thickness of the hole transport layer is 25 nm. At normal temperature and pressure, the energy band distribution of each sub-layer of the obtained hole transport layer is tested using X-ray photoelectron spectrometer (XPS) with a model of Escalab 250Xi (from Thermo Scientific). The results are shown in Table 3.

TABLE 1

| Number of target material | Inorganic hole transport material | | Doping material | |
|---|---|---|---|---|
| | Type | Mass percentage content | Type | Mass percentage content |
| 1# | NiOx | 100% | / | / |
| 2# | NiOx | 99.5% | Ag | 0.5% |
| 3# | NiOx | 99.0% | Ag | 1.0% |
| 4# | NiOx | 98.0% | Ag | 2.0% |

TABLE 2

| Number of target material | Sputtering air pressure mbar | Working gas | Gas flow rate sccm | Heating temperature ° C. | Sputtering power W | Target base spacing mm |
|---|---|---|---|---|---|---|
| 1# | $2.3 \times 10^{-3}$ | $O_2$ | 200 | 125 | 200 | 79.5 |
| 2# | $2.3 \times 10^{-3}$ | $O_2$ | 200 | 125 | 200 | 79.5 |
| 3# | $2.3 \times 10^{-3}$ | $O_2$ | 200 | 125 | 200 | 79.5 |
| 4# | $2.3 \times 10^{-3}$ | $O_2$ | 200 | 125 | 200 | 79.5 |

TABLE 3

| Number of sub-layer | Thickness nm | CBM eV | VBM eV | ΔEg eV |
|---|---|---|---|---|
| 1# | 5 | −1.31 | −5.14 | 3.83 |
| 2# | 5 | −1.38 | −5.20 | 3.82 |
| 3# | 5 | −1.44 | −5.26 | 3.80 |
| 4# | 10 | −1.51 | −5.30 | 3.79 |

Preparation of Light Absorbing Layer

The obtained hole transport layer is spin-coated with an $MAPbI_3$ dimethylformamide solution at a concentration of 1 mol/L at a speed of 3,000 rpm to 4,500 rpm, same is then moved to a constant-temperature heating table and heated at 100° C. for 30 min, and cooled to room temperature to form a light absorbing layer with a thickness of 500 nm.

Preparation of Electron Transport Layer

The obtained light absorbing layer is spin-coated with an $PC_{60}BM$ chlorobenzene solution at a concentration of 20 mg/L at a speed of 800 rpm to 1,500 rpm, same is then moved to a constant-temperature heating table and heated at 150° C. for 15 min, and cooled to room temperature to form an electron transport layer with a thickness of 70 nm.

Preparation of Ag Electrode

The above-mentioned sample is put into a vacuum coating machine and an Ag electrode is evaporated on the surface of the obtained electron transport layer under a vacuum condition of $5 \times 10^{-4}$ Pa with a thickness of 80 nm.

Figure 3:
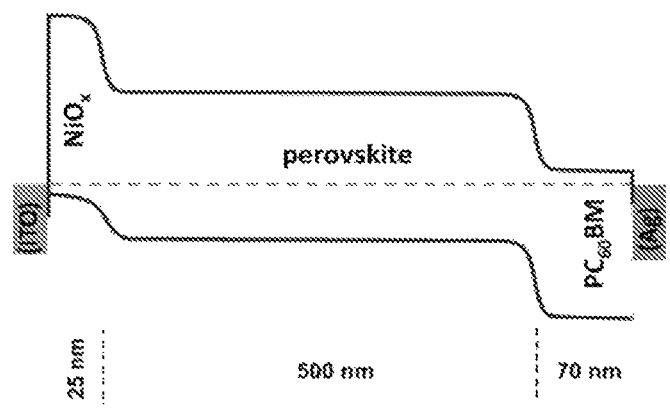
FIG. 3 is a schematic diagram of an energy level distribution of the solar cell of Example 1.

The structure of the solar cell finally prepared in Example 1 is ITO/doped $NiO_x/MAPbI_3/PC_{60}BM/Ag$ and the schematic diagram of the energy level distribution of the solar cell prepared in Example 1 is shown in FIG. 3.

The solar cell obtained by the method of the present application has better stability and consistency, and the energy level structure of the hole transport layer in the solar cell can also be conveniently adjusted by adjusting the specific composition of the target material or replacing the target material, thereby facilitating the energy level matching and optimization between the light absorbing layer/hole transport layer.

Table 4 shows the test results of short-circuit voltage Voc, short-circuit current density Jsc, fill factor and energy conversion efficiency of the solar cell prepared in Example 1.

TABLE 4

| | Voc (V) | Jsc (mA/cm$^2$) | Fill Factor (%) | Efficiency (%) |
|---|---|---|---|---|
| Example 1 | 1.07 | 20.8 | 65.0 | 14.3 |

Described above are merely specific embodiments of the present application, and the scope of protection of the present application is not limited thereto; any equivalent modification or replacement can be readily conceived by a person skilled in the art according to the technical range of the disclosure of the present application, and shall fall within the protection scope of the present application. Therefore, the scope of protection of the present application shall be determined by the claims.

What is claimed is:

1. A hole transport layer for a solar cell, comprising:
N consecutive sub-layers, N≥2;
wherein:
each of the sub-layers comprises an inorganic hole transport material;
one of the N sub-layers is a doped sub-layer further comprising a doping material; and
the doped sub-layer is the 1st sub-layer or the N-th sub-layer, and the doping material at least comprises KI.

2. The hole transport layer according to claim 1, wherein the inorganic hole transport materials of the sub-layers are same as each other.

3. The hole transport layer according to claim 1, wherein the doping material further comprises one or more of $NiO_x$, CuO, $Cu_2O$, CuzS, CuI, CuSCN, $CuGaO_2$, MgO, MnO, $MnO_2$, Ag, $Ag_2O$, Co, CoO, Li, Cs, Pb, In, Ga, Hg, $Hg_2O$, $Cr_2O_3$, SnO, SnS, PbO, or $Pr_2O_3$.

4. The hole transport layer according to claim 1, wherein based on a mass of the doped sub-layer, a total mass percentage content of the doping material in the doped sub-layer is smaller than or equal to 25%.

5. The hole transport layer according to claim 1, wherein the doped sub-layer of the hole transport layer satisfies at least one of:
a mass percentage content of KI in the doped sub-layer is smaller than or equal to 20%; or
the doped sub-layer comprises MgO and KI, and a mass percentage content of each of MgO and KI in the doped sub-layer is independently smaller than or equal to 20%.

6. The hole transport layer according to claim 1, wherein:
the N sub-layers have gradient increase or decrease in forbidden band width, and an absolute value of a difference between forbidden band widths of two adjacent ones of the sub-layers, |ΔEg(HTL)|, satisfies: 0 eV<|ΔEg(HTL)|≤1.5 eV; and/or
the N sub-layers have gradient increase or decrease in conduction band bottom energy level, and an absolute value of a difference between conduction band bottom energy levels of two adjacent ones of the sub-layers, |ΔCBM(HTL)|, satisfies: 0 eV<|ΔCBM(HTL)|≤1.5 eV.

7. The hole transport layer according to claim 1, wherein the hole transport layer has a total thickness of 5 nm to 150 nm.

8. A solar cell, comprising:
a hole transport layer comprising:
N consecutive sub-layers, N≥2;
wherein:
each of the sub-layers comprises an inorganic hole transport material;
one of the N sub-layers is a doped sub-layer further comprising a doping material; and
the doped sub-layer is the 1st sub-layer or the N-th sub-layer, and the doping material at least comprises KI.

9. A photovoltaic module, comprising the solar cell according to claim 8.

10. The hole transport layer according to claim 1, wherein the N sub-layers further comprises another doped sub-layer, and the another doped sub-layer of the hole transport layer satisfies at least one of:
the another doped sub-layer comprises one or more of $NiO_x$, CuO, $Cu_2O$, $Cu_2S$, CuI, CuSCN, $CuGaO_2$, Ag, and $Ag_2O$, and a mass percentage content of each of the one or more of $NiO_x$, CuO, $Cu_2O$, $Cu_2S$, CuI, CuSCN, $CuGaO_2$, Ag, and $Ag_2O$ in the another doped sub-layer is independently smaller than or equal to 15%;
the another doped sub-layer comprises one or two of MgO and KI, and a mass percentage content of each of the one or two of MgO and KI in the another doped sub-layer is independently smaller than or equal to 20%;
the another doped sub-layer comprises one or two of MnO and $MnO_2$, and a mass percentage content of each of the one or two of MnO and $MnO_2$ in the another doped sub-layer is independently smaller than or equal to 10%;
the another doped sub-layer comprises one or two of Co and CoO, and a mass percentage content of each of the one or two of Co and CoO in the another doped sub-layer is independently smaller than or equal to 8%; or
the another doped sub-layer comprises one or more of Li, Cs, Pb, In, Ga, Hg, $Hg_2O$, $Cr_2O_3$, SnO, SnS, PbO, and $Pr_2O_3$, and a mass percentage content of each of the one or more of Li, Cs, Pb, In, Ga, Hg, $Hg_2O$, $Cr_2O_3$, SnO, SnS, PbO, and $Pr_2O_3$, in the another doped sub-layer is independently smaller than or equal to 25%.

11. A method for forming the hole transport layer of claim 1 on a surface of a substrate, comprising:
providing M target materials comprising the inorganic hole transport materials; and
forming the hole transport layer on the surface of the substrate using magnetron sputtering, the hole transport layer at least comprising the N consecutive sub-layers;
wherein M and N are integers, 2≤N≤M, and one of the M target materials is a doped target material further comprising the doping material.

12. The method according to claim 11, wherein the inorganic hole transport materials of the target materials are same as each other.

13. The method according to claim 11, wherein the doping material further comprises one or more of $NiO_x$, CuO, $Cu_2O$, $Cu_2S$, CuI, CuSCN, $CuGaO_2$, MgO, MnO, $MnO_2$, Ag, $Ag_2O$, Co, CoO, Li, Cs, Pb, In, Ga, Hg, $Hg_2O$, $Cr_2O_3$, SnO, SnS, PbO, or $Pr_2O_3$.

14. The method according to claim 1, wherein the doped target material is the 1st target material or the M-th target material.

15. The method according to claim 11, wherein based on a mass of the doped target material, a total mass percentage content of the doping material in the doped target material is smaller than or equal to 25%.

16. The method according to claim 15, wherein the doped target material satisfies:
   a mass percentage content of KI in the doped target material is smaller than or equal to 20%; or
   the doped target material comprises MgO and KI, and a mass percentage content of each of MgO and KI in the doped target material is independently smaller than or equal to 20%.

17. The method according to claim 11, wherein the hole transport layer has a gradient change in energy level.

18. The method according to claim 17, wherein:
   the hole transport layer has a gradient change in forbidden band width, the M target materials have a gradient change in forbidden band width, and an absolute value of a difference between forbidden band widths of two adjacent ones of the target materials, $|\Delta Eg(TAG)|$, satisfies: $0\ eV \leq |\Delta Eg(TAG)| \leq 1.5\ eV$; and/or
   the hole transport layer has a gradient change in conduction band bottom energy level, the M target materials have a gradient change in conduction band bottom energy level, and an absolute value of a difference between conduction band bottom energy levels of two adjacent ones of the target materials, $|\Delta CBM(TAG)|$, satisfies: $0\ eV \leq |\Delta CBM(TAG)| \leq 1.5\ eV$.

19. The method according to claim 11, wherein the substrate comprises a transparent electrode, a metal electrode, or a conductive carbon electrode.

20. The method according to claim 11, wherein the magnetron sputtering satisfies at least one of:
   a sputtering air pressure is $2 \times 10^{-3}$ mbar to $8 \times 10^{-3}$ mbar;
   a gas flow rate is 50 sccm to 250 sccm;
   a heating temperature is 0° C. to 200° C.;
   a sputtering power is 200 W to 13 KW; or
   a target base spacing is 60 mm to 120 mm.

* * * * *